(12) United States Patent
Wang et al.

(10) Patent No.: US 10,777,583 B2
(45) Date of Patent: Sep. 15, 2020

(54) ARRAY SUBSTRATE, METHOD FOR MANUFACTURING THE SAME AND DISPLAY PANEL

(71) Applicants: BOE Technology Group Co., Ltd., Beijing (CN); Beijing BOE Display Technology Co., Ltd., Beijing (CN)

(72) Inventors: Zhidong Wang, Beijing (CN); Yun Qiu, Beijing (CN); Lianjie Qu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 143 days.

(21) Appl. No.: 15/962,066

(22) Filed: Apr. 25, 2018

(65) Prior Publication Data

US 2019/0006389 A1 Jan. 3, 2019

(30) Foreign Application Priority Data

Jul. 3, 2017 (CN) .......................... 2017 1 0536548

(51) Int. Cl.
*H01L 27/12* (2006.01)
*H01L 29/786* (2006.01)
*H01L 23/00* (2006.01)

(52) U.S. Cl.
CPC ............ *H01L 27/124* (2013.01); *H01L 24/19* (2013.01); *H01L 24/20* (2013.01);
(Continued)

(58) Field of Classification Search
CPC ... H01L 27/124; H01L 27/1218; H01L 24/20; H01L 24/19; H01L 27/1262;
(Continued)

(56) References Cited

U.S. PATENT DOCUMENTS 8,791,474 B1 * 7/2014 Bibl ..................... G09G 3/2003
257/100
10,209,542 B1 * 2/2019 Shen ..................... H01L 27/124
(Continued)

FOREIGN PATENT DOCUMENTS

CN 1519617 A 8/2004
CN 106783874 A 5/2017

OTHER PUBLICATIONS

First Office Action, including Search Report, for Chinese Patent Application No. 201710536548.1, dated Apr. 26, 2019, 14 pages.

*Primary Examiner* — Hoang-Quan Ho
(74) *Attorney, Agent, or Firm* — Westman, Champlin & Koehler, P.A.

(57) ABSTRACT

An array substrate, a method for manufacturing the same and a display panel are provided. The array substrate comprises: a substrate; a bare chip fixed on the substrate, the bare chip comprising pins; a buffer layer and a first metallic layer disposed sequentially on the bare chip, the first metallic layer comprising outer leads in one-to-one correspondence with the pins of the bare chip, the outer leads being connected electrically to the pins corresponding thereto of the bare chip, and the outer leads being electrically insulated from each other; a thin film transistor; and a first signal wire and a first connecting wire disposed in a same layer as a gate electrode of the thin film transistor, and a second signal wire and a second connecting wire disposed in a same layer as a source electrode and a drain electrode of the thin film transistor.

20 Claims, 7 Drawing Sheets

(52) U.S. Cl.
CPC ...... *H01L 27/1218* (2013.01); *H01L 27/1262* (2013.01); *H01L 29/78675* (2013.01); *H01L 24/29* (2013.01); *H01L 24/32* (2013.01); *H01L 24/73* (2013.01); *H01L 24/83* (2013.01); *H01L 24/92* (2013.01); *H01L 29/78633* (2013.01); *H01L 2224/04105* (2013.01); *H01L 2224/2919* (2013.01); *H01L 2224/32225* (2013.01); *H01L 2224/73267* (2013.01); *H01L 2224/83192* (2013.01); *H01L 2224/92244* (2013.01); *H01L 2924/15153* (2013.01)

(58) Field of Classification Search
CPC ............... H01L 29/78675; H01L 24/92; H01L 2224/92244; H01L 2224/2919; H01L 24/73; H01L 29/78633; H01L 2224/32225; H01L 2224/73267; H01L 2924/15153; H01L 2224/83192; H01L 2224/04105; H01L 24/29; H01L 24/83; H01L 24/32; H01L 27/1259; H01L 27/1214

See application file for complete search history.

(56) References Cited

U.S. PATENT DOCUMENTS

| | | | |
|---|---|---|---|
| 10,209,597 B1 * | 2/2019 | Shen | ................ H01L 27/1218 |
| 2015/0187991 A1 * | 7/2015 | McGroddy | ........... H01L 27/016 |
| | | | 257/13 |

* cited by examiner

ARRAY SUBSTRATE, METHOD FOR MANUFACTURING THE SAME AND DISPLAY PANEL

CROSS-REFERENCE TO RELATED APPLICATION

The present disclosure claims the benefit of Chinese Patent Application No. 201710536548.1, entitled "array substrate, method for manufacturing the same and display panel" and filed on Jul. 3, 2017 before the State Intellectual Property Office of China, the entirety of which is incorporated herein by reference.

BACKGROUND OF THE DISCLOSURE

Field of the Disclosure

The present disclosure relates to the field of displaying technology, and particularly to an array substrate, a method for manufacturing the same and a display panel.

Description of the Related Art

The displaying technology with thin film field-effect transistor (abbreviated as TFT) has become the mainstream displaying technology, and has become more and more mature. It is of great significance to low the costs of the TFT display devices so as to enhance competitiveness.

Nowadays, on an array substrate for TFT display panel, in addition to forming in a displaying region a displaying structure comprising TFT, transparent electrodes, etc. and forming in a non-displaying region metal wiring, it is also necessary to bind a chip by binding process onto a chip arrangement region of the non-displaying region. In this case, the chips to be bound onto array substrate are always ones that have been encapsulated.

SUMMARY

The examples of the present disclosure provide an array substrate, a method for manufacturing the same and a display panel.

The examples of the present disclosure provide an array substrate, comprising
  a substrate;
  a bare chip fixed on the substrate, the bare chip comprising pins;
  a buffer layer and a first metallic layer disposed sequentially on a side of the bare chip facing away from the substrate, the first metallic layer comprising outer leads in one-to-one correspondence with the pins of the bare chip, the outer leads being connected electrically to the pins corresponding thereto of the bare chip through via holes in the buffer layer, and the outer leads being electrically insulated from each other;
  a thin film transistor; and
  a first signal wire and a first connecting wire disposed in a same layer as a gate electrode of the thin film transistor, and a second signal wire and a second connecting wire disposed in a same layer as a source electrode and a drain electrode of the thin film transistor, one end of the first connecting wire being connected electrically to the first signal wire, and the other end thereof being connected electrically to one of the outer leads, one end of the second connecting wire being connected electrically to the second signal wire, and the other end thereof being connected electrically to one of the outer leads, and the first connecting wire and the second connecting wire being electrically insulated from each other.

In some examples of the present disclosure, the substrate comprises a recess in which the bare chip is fixed.

In some examples of the present disclosure, in each recess a bare chip is fixed, and the size of the recess is consistent with that of the bare chip.

In some examples of the present disclosure, an outer surface of the bare chip fixed inside the recess is flush with a surface of the substrate.

In some examples of the present disclosure, the first metallic layer further comprises a light shielding pattern.

In some examples of the present disclosure, the thin film transistor is a polycrystalline silicon thin film transistor, and an orthographic projection of the light shielding pattern on the substrate covers an orthographic projection of an active layer of the polycrystalline silicon thin film transistor on the substrate.

In some examples of the present disclosure, the array substrate further comprises a first passivation layer disposed on a side of the thin film transistor facing away from the substrate.

In some examples of the present disclosure, the array substrate further comprises a planarization layer and a first transparent electrode disposed sequentially on a side of the first passivation layer facing away from the substrate, the first transparent electrode being electrically connected to the drain electrode.

In some examples of the present disclosure, sizes of the outer leads are greater than sizes of the pins of the bare chip.

The examples of the present disclosure also provide a display panel comprising an array substrate provided by the present disclosure.

The examples of the present disclosure also provide a method for manufacturing an array substrate, comprising the steps of:
  fixing a bare chip on a substrate, the bare chip comprising pins;
  forming on the substrate, on which the bare chip is fixed, sequentially a buffer layer and a first metallic layer, the first metallic layer comprising outer leads in one-to-one correspondence with the pins of the bare chip, the outer leads being connected electrically to the pins corresponding thereto of the bare chip through via holes in the buffer layer, and the outer leads being electrically insulated from each other; and
  forming on the substrate, on which the first metallic layer is formed, a thin film transistor, a first signal wire and a first connecting wire disposed in a same layer as a gate electrode of the thin film transistor, and a second signal wire and a second connecting wire disposed in a same layer as a source electrode and a drain electrode of the thin film transistor, one end of the first connecting wire being connected electrically to the first signal wire, the other end thereof being connected electrically to one of the outer leads, one end of the second connecting wire being connected electrically to the second signal wire, the other end thereof being connected electrically to one of the outer leads, and the first connecting wire and the second connecting wire being electrically insulated from each other.

In some examples of the present disclosure, the step of fixing a bare chip on a substrate comprises:
  forming a recess in the substrate, and forming a binder layer inside the recess or on the bare chip; and
  placing the bare chip into the recess, and fixing the chip by the binder layer.

In some examples of the present disclosure, in each recess a bare chip is fixed, and the size of the recess is consistent with that of the bare chip.

In some examples of the present disclosure, an outer surface of the bare chip fixed inside the recess is flush with a surface of the substrate.

In some examples of the present disclosure, the first metallic layer further comprises a light shielding pattern, the thin film transistor is a polycrystalline silicon thin film transistor, and an orthographic projection of the light shielding pattern on the substrate covers an orthographic projection of an active layer of the polycrystalline silicon thin film transistor on the substrate.

In some examples of the present disclosure, the method further comprises: forming a first passivation layer on a side of the thin film transistor facing away from the substrate.

In some examples of the present disclosure, sizes of the outer leads are greater than sizes of the pins of the bare chip.

In some examples of the present disclosure, the step of forming on the substrate, on which the first metallic layer is formed, a thin film transistor, a first signal wire and a first connecting wire disposed in a same layer as a gate electrode of the thin film transistor, and a second signal wire and a second connecting wire disposed in a same layer as a source electrode and a drain electrode of the thin film transistor comprises:

forming sequentially a polycrystalline silicon active layer, a gate insulating layer, and a gate metallic layer comprising a gate electrode, a first signal wire and a first connecting wire, one end of the first connecting wire being connected electrically to the first signal wire, and the other end thereof being connected electrically to one of the outer leads through a via hole in the gate insulating layer; and forming sequentially an interlayer insulating layer, and a source-drain metallic layer comprising a source electrode, a drain electrode, a second signal wire and a second connecting wire, one end of the second connecting wire being connected electrically to the second signal wire, and the other end thereof being connected electrically to one of the outer leads through via holes in the interlayer insulating layer and in the gate insulating layer.

In some examples of the present disclosure, the first metallic layer further comprises a light shielding pattern, and the polycrystalline silicon active layer is formed above the light shielding pattern.

In some examples of the present disclosure, the method further comprises forming on the first passivation layer sequentially a planarization layer and a first transparent electrode, the first transparent electrode being connected electrically to the drain electrode.

BRIEF DESCRIPTION OF THE DRAWINGS

In order to describe more clearly the technical solutions of the embodiments of the present disclosure, the drawings referred to in the description of the embodiments will be briefly described hereinafter. Obviously, the drawings described below relate to only some of the embodiments of the present disclosure. A person skilled in the art can obtain other drawings on the basis of these drawings without exercising inventive skill.

DETAILED DESCRIPTION OF PREFERRED EMBODIMENTS OF THE DISCLOSURE

Figure 1:
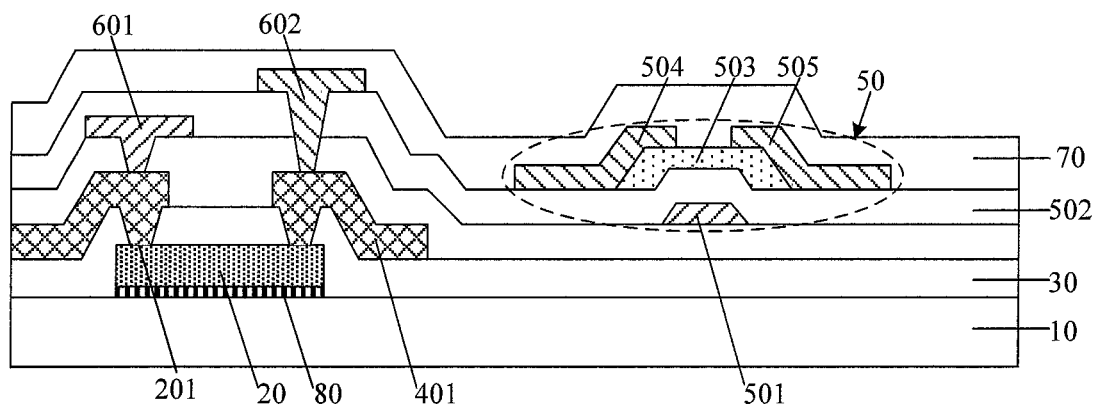
FIG. 1 is a structural schematic diagram of a first array substrate provided by the present disclosure.

Technical solutions of the embodiments of the present disclosure will be described hereinafter in more detail with reference to the drawings of the embodiments of the present disclosure. Obviously, the described embodiments are only some of the embodiments of the present disclosure, not all the embodiments. All other embodiments that can be obtained by a person skilled in the art in the light of the described embodiments of the present disclosure without exercising inventive skill shall fall within the protection scope of the present disclosure.

The technical or scientific terms used for the present disclosure shall have the conventional meanings that a person skilled in the art understands, unless otherwise defined. The terms "first", "second" and the like used for the present disclosure do not imply any sequence, amount or importance; they just function to distinguish different constituent parts. The terms "vertical" and "horizontal" used for the present disclosure have relative meanings instead of absolute meanings. For example, the word "vertical" can be construed as referring to a first direction and the word "horizontal" as referring to a second direction generally perpendicular to the first direction. The terms "include" or "contain" and the like mean that the element or article preceding these terms covers the element or article or the equivalent thereof enumerated after these terms, without excluding other elements or articles. The terms "connect" or "interconnect" and the like do not confine themselves to a physical or mechanical connection. Rather, it can involve an electrical connection, either directly or indirectly. The terms "upper", "lower", "right" and "left" and the like only express relative positional relationship; if the absolute position of the described object changes, the relative positional relationship may also change correspondingly.

In the embodiments and the drawings of the present disclosure, the same reference signs have the same meaning, unless otherwise defined. Furthermore, in the drawings of the embodiments of the present disclosure, only the structures to which the embodiments of the present disclosure relate are illustrated and other structures can be referred to a conventional design. In the drawings describing the embodiments of the present disclosure, the thicknesses of the layers or regions are exaggerated for the purpose of clarity. It is to be understood that when such an element as a layer, a film, a region or a base substrate is referred to as situating "above" or "under" another element, the element may "directly" situate "above" or "under" the other element, or there may be an interposed element between them.

In the present disclosure, the "outer surface" of the bare chip situated in the recess refers to the surface exposed to outside after the bare chip is situated in the recess, that is, the surface opposing to the surface which is fixed to the bottom of the recess with a binder layer. Bare chip refers to a chip that is not encapsulated.

The examples of the present disclosure provide an array substrate, a method for manufacturing the same and a display panel comprising the array substrate. According to the present disclosure, a bare chip is firstly fixed on a substrate, and then a buffer layer and a first metallic layer are formed, so that the buffer layer functions as an interposer layer encapsulating the bare chip, and the leading out and amplification of the pins of the bare chip are realized through the outer leads of the first metallic layer. As such, during the formation of the thin film transistor, the first signal wire disposed in the same layer as the gate electrode and the second signal wire disposed in the same layer as the source electrode and the drain electrode may be brought into electrical connection to the bare chip, without needing a binding process. Subsequently, protection of the bare chip is achieved by forming a first passivation layer. In this way, in the examples of the present disclosure, the encapsulation of the bare chip is completed at the same time with the formation of the thin film transistor and the first passivation layer, and therefore the cost of the chip may be lowered to some extent, thus lowering the cost of the display apparatus in which the array substrate is employed.

As shown in FIG. 1, an array substrate provided by the examples of the present disclosure comprises: a substrate 10; a bare chip 20 fixed on the substrate 10, the bare chip 20 comprising pins 201; a buffer layer 30 and a first metallic layer disposed sequentially on a side of the bare chip 20 facing away from the substrate 10, wherein the first metallic layer comprises outer leads 401 in one-to-one correspondence with the pins 201 of the bare chip 20, the outer leads 401 are connected to the pins corresponding thereto of the bare chip 20 through via holes in the buffer layer 30, the sizes of the outer leads 401 are greater than the sizes of the pins of the bare chip 20, and the outer leads 401 are electrically insulated from each other; a thin film transistor 50 disposed on a side of the first metallic layer facing away from the substrate 10, a first signal wire 701 and a first connecting wire 601 disposed in a same layer as a gate electrode 501 of the thin film transistor 50, and a second signal wire 702 and a second connecting wire 602 disposed in a same layer as a source electrode 504 and a drain electrode 505 of the thin film transistor 50; and a first passivation layer 70 disposed on a side of the thin film transistor 50 facing away from the substrate 10. One end of the first connecting wire 601 is connected electrically to the first signal wire, and the other end is connected electrically to an outer lead 401; one end of the second connecting wire 602 is connected electrically to the second signal wire, and the other end is connected electrically to an outer lead 401; wherein the first connecting wire 601 and the second connecting wire 602 are electrically insulated from each other. It shall be noted that the first passivation layer 70 is optional. As an example, in the examples of the present disclosure, the array substrate may be free of the first passivation layer 70.

Figure 1A:
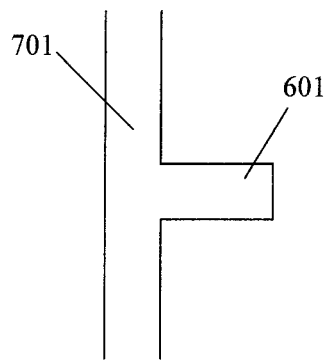
FIG. 1a is a partial top view showing an exemplary connection of a first signal wire and a first connecting wire in the array substrate.
Figure 1B:
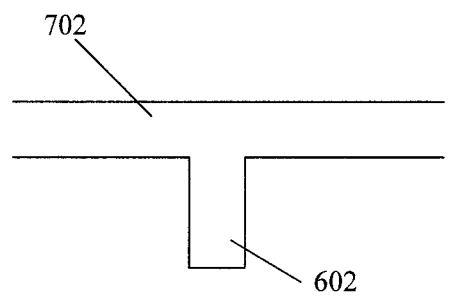
FIG. 1b is a partial top view showing an exemplary connection of a second signal wire and a second connecting wire in the array substrate.

In FIGS. 1a and 1b, the connection relationship of the first signal wire 701 and the first connecting wire 601 as well as the connection relationship of the second signal wire 702 and the second connecting wire 602 are schematically shown.

Figure 2:
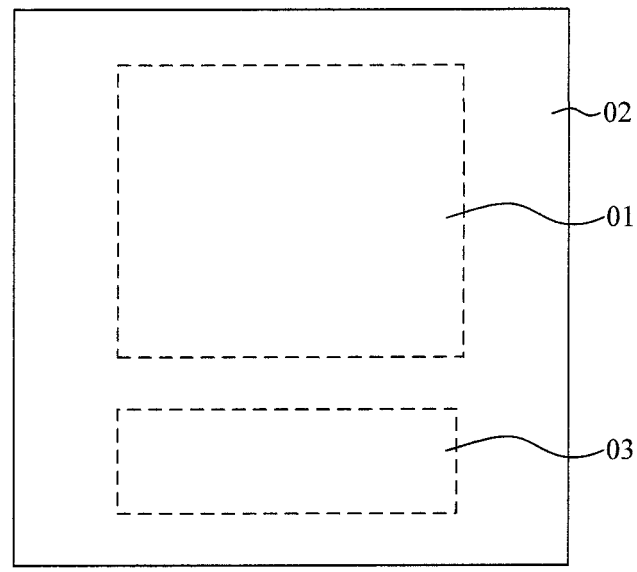
FIG. 2 is a schematic diagram showing a displaying region, a non-displaying region and a chip arrangement region on the substrate.

It shall be noted that, firstly, as shown in FIG. 2, the array substrate comprises a displaying region 01 and a non-displaying region 02. Such displaying elements as the thin film transistor 50 are disposed in the displaying region 01, and the bare chip 20 is disposed in the chip arrangement region 03 in the non-displaying region 02. Of course, wirings are additionally disposed in the other region of the non-displaying region 02.

Secondly, the bare chip 20 may be fixed on the substrate 10 by a binder layer 80. The bare chip 20 is an unencapsulated chip.

In this case, the bare chip 20 disposed on the array substrate is not restricted to be only one, and may be two and more. The chip may be a bare chip 20 for driving, a bare chip 20 for timing control, etc.

Thirdly, the pins of the bare chip 20 locate on the surface of the bare chip 20. Since the size of the pins of the bare chip 20 is in the order of nanometer, the pins of the bare chip 20 may be amplified by providing outer leads 401 in one-to-one correspondence with each pin of the bare chip 20 and by electrically connecting the outer leads 401 to the pins corresponding thereto of the bare chip 20, so as to enable a subsequent precise abutment with other metallic wires.

In this case, the outer leads 401 may be dimensioned as required by the actual circumstances, insofar as the electrical connection to the first connecting wire 601 and the second connecting wire 602 is enabled.

Fourthly, by the first connecting wire 601, the bare chip 20 is allowed to provide signal to the first signal wire disposed in the same layer as the gate electrode 501; and by the second connecting wire 602, the bare chip 20 is allowed to provide signal to the second signal wire disposed in the same layer as the source electrode 504 and the drain electrode 505.

In this case, the first connecting wire 601 and the second connecting wire 602 shall be connected to different outer leads 401. Of course, electrical insulation is ensured between the first signal wires, between the second signal wires, and between the first signal wires and the second signal wires.

Fifthly, the thin film transistor 50 is not limited in term of its type, that is, it may be a thin film transistor 50 of any structural type.

According to the examples of the present disclosure, the bare chip 20 is firstly fixed on the substrate 10, and then the buffer layer 30 and the first metallic layer are formed, so that the buffer layer 30 functions as an interposer layer encapsulating the bare chip 20 and the leading out and amplification of the pins of the bare chip 20 are realized through the outer leads 401 of the first metallic layer. As such, during the formation of the thin film transistor 50, the first signal wire disposed in the same layer as the gate electrode 501 and the second signal wire disposed in the same layer as the source electrode 504 and the drain electrode 505 may be brought into electrical connection to the bare chip 20, without needing a binding process. Subsequently, protection of the bare chip 20 is achieved by forming a first passivation layer 70. In this way, in the examples of the present disclosure, the encapsulation of the bare chip 20 is completed at the same time with the formation of the thin film transistor 50 and the first passivation layer 70, and therefore the cost of the chip may be lowered to some extent, thus lowering the cost of the display apparatus in which the array substrate is employed.

Figure 3:
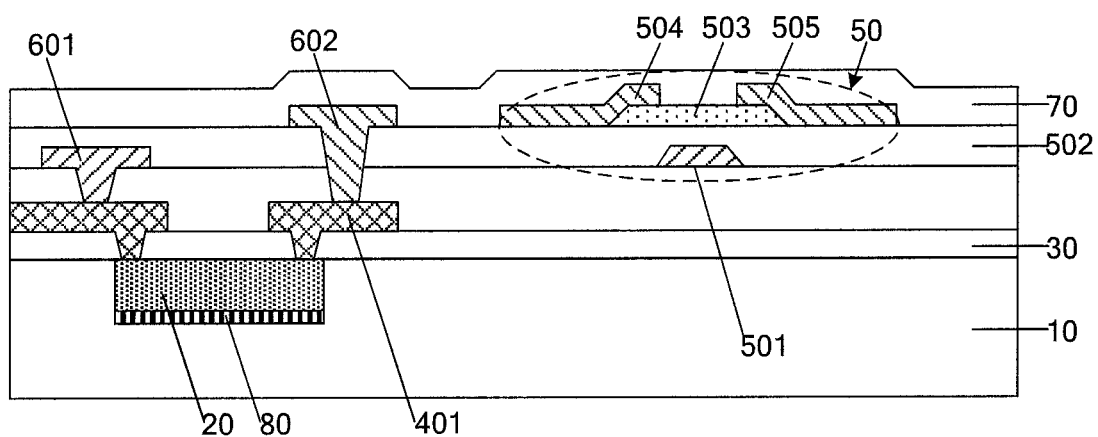
FIG. 3 is a structural schematic diagram of a second array substrate provided by the present disclosure.

In an example, as shown in FIG. 3, the substrate 10 comprises a recess, and the bare chip 20 is fixed inside the recess.

By disposing the bare chip 20 inside the recess of the substrate 10, the surface of the substrate 10 on which the bare chip 20 is disposed is somewhat smoothed, thereby facilitating the subsequent processes and improving the conformity rate.

In an example, a bare chip 20 is fixed in each recess, and the size of the recess is consistent with the size of the bare chip 20. In this way, it may be prevented that a gap exists between the recess and the bare chip 20, by which a high step occurs on the surface of the substrate 10.

In an example, as shown in FIG. 3, the outer surface of the bare chip 20 fixed inside the recess is flush with the surface of the substrate 10. That is, the combined height of the binder layer 80 and the bare chip 20 is equal to the depth of the recess.

By having the outer surface of the bare chip 20 fixed in the recess being flush with the surface of the substrate 10, the smoothness of the surface of the substrate 10 on which the bare chip 20 is disposed may be ensured, thereby further facilitating the subsequent processes and improving the conformity rate.

Figure 4:
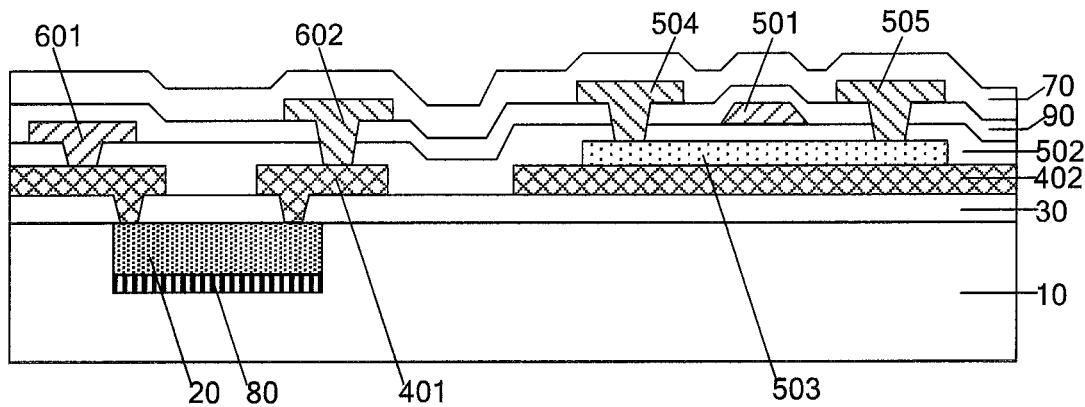
FIG. 4 is a structural schematic diagram of a third array substrate provided by the present disclosure.

In an example, as shown in FIG. 4, the first metallic layer further comprises a light shielding pattern 402. In this case, the thin film transistor 50 is a polycrystalline silicon thin film transistor, and the orthographic projection of the light shielding pattern 402 on the substrate 10 covers the orthographic projection of an active layer 503 of the polycrystalline silicon thin film transistor on the substrate 10.

In case where the thin film transistor 50 is a polycrystalline silicon thin film transistor, by providing a light shielding pattern 402 between the substrate 10 and the active layer 503, impact on the performance of the polycrystalline silicon thin film transistor due to light irradiation on the active layer 503 in polycrystalline silicon material may be prevented. In this case, by disposing the light shielding pattern 402 and the outer leads 401 in the same layer, that is, by forming the light shielding pattern 402 and the outer leads 401 through the same patterning process, the encapsulation of the bare chip 20 will not result in the increase of the times of the patterning processes.

Figure 5:
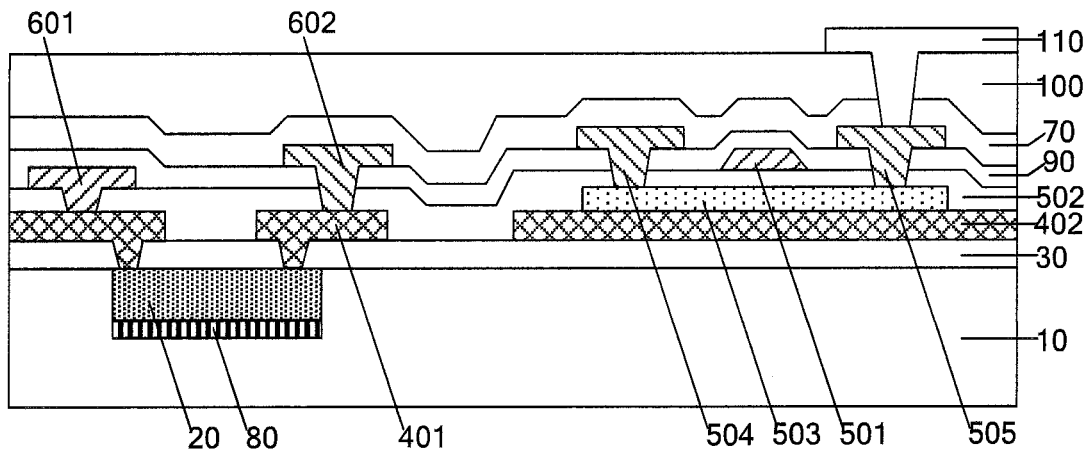
FIG. 5 is a structural schematic diagram of a fourth array substrate provided by the present disclosure.
Figure 6:
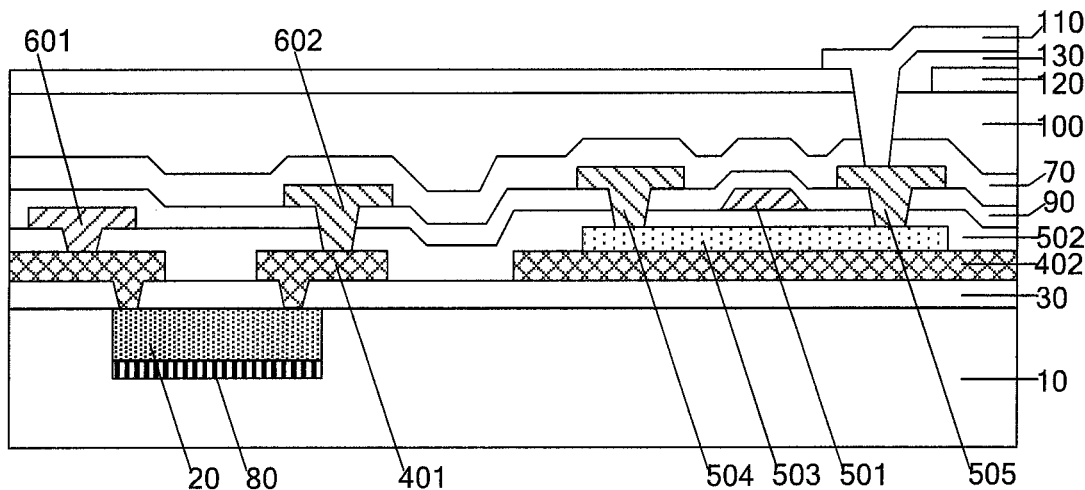
FIG. 6 is a structural schematic diagram of a fifth array substrate provided by the present disclosure.

In an example, as shown in FIGS. 5 and 6, the array substrate further comprises a planarization layer 100 and a first transparent electrode 110 disposed sequentially on a side of the first passivation layer 70 facing away from the substrate 10, and the first transparent electrode 110 is electrically connected to the drain electrode 505.

In this case, the planarization layer 100 may be made from resin material, and may function to further protect the bare chip 20.

The first transparent electrode 110 may be a pixel electrode or an anode electrode.

In case where the first transparent electrode 110 is a pixel electrode, as shown in FIG. 6, the array substrate may optionally further comprise a second transparent electrode 120, i.e. a common electrode. The first transparent electrode 110 and the second transparent electrode 120 are separated by a second passivation layer 130.

In case where the first transparent electrode 110 is an anode electrode, the array substrate further comprises an organic functional layer and a cathode electrode disposed sequentially above the anode electrode.

The examples of the present disclosure further provide a display panel comprising the above-mentioned array substrate.

In this case, the display panel may be a liquid crystal display panel. It may also be an organic light-emitting diode display panel.

The advantages of the display panel are the same as those of the array substrate and will not be reiterated here.

The examples of the present disclosure further provide a method for manufacturing an array substrate. Referring to FIG. 1, the method comprises the steps of: fixing a bare chip 20 on a substrate 10, the bare chip 20 comprising pins; forming on the substrate 10, on which the bare chip 20 is fixed, sequentially a buffer layer 30 and a first metallic layer, wherein the first metallic layer comprises outer leads 401 in one-to-one correspondence with the pins of the bare chip 20, the outer leads 401 are connected to the pins corresponding thereto of the bare chip 20 through via holes in the buffer layer 30, the sizes of the outer leads 401 are greater than sizes of the pins of the bare chip 20, and the outer leads 401 are electrically insulated from each other; and forming on the substrate 10, on which the first metallic layer is formed, a thin film transistor 50, a first signal wire 701 and a first connecting wire 601 disposed in a same layer as a gate electrode 501 of the thin film transistor 50, and a second signal wire 702 and a second connecting wire 602 disposed in a same layer as a source electrode 504 and a drain electrode 505 of the thin film transistor 50, wherein one end of the first connecting wire 601 is connected electrically to the first signal wire, the other end is connected electrically to an outer lead 401, one end of the second connecting wire 602 is connected electrically to the second signal wire, the other end is connected electrically to an outer lead 401, and the first connecting wire 601 and the second connecting wire 602 are electrically insulated from each other; and forming a first passivation layer 70 on the substrate 10, on which the thin film transistor 50 is formed.

In the method for manufacturing an array substrate provided by the examples of the present disclosure, the bare chip 20 is firstly fixed on the substrate 10, and then the buffer layer 30 and the first metallic layer are formed, so that the buffer layer 30 functions as an interposer layer encapsulating the bare chip 20 and the leading out and amplification of the pins of the bare chip 20 are realized through the outer leads 401 of the first metallic layer. As such, during the formation of the thin film transistor 50, the first signal wire formed by the same patterning process as the gate electrode 501 and the second signal wire formed by the same patterning process as the source electrode 504 and the drain electrode 505 may be brought into electrical connection to the bare chip 20, without needing a binding process. Subsequently, protection of the bare chip 20 is achieved by forming a first passivation layer 70. In this way, in the examples of the present disclosure, the encapsulation of the bare chip 20 is completed at the same time with the formation of the thin film transistor 50 and the first passivation layer 70, and therefore the cost of the chip may be lowered to some extent, thus lowering the cost of the display apparatus in which the array substrate is employed.

Referring to FIG. 3, in an example, the step of fixing a bare chip 20 on a substrate 10 comprises: forming a recess in the substrate 10, and forming a binder layer 80 inside the recess; placing the bare chip 20 into the recess, and fixing the chip by the binder layer 80.

In this case, the recess may be formed in the substrate 10 by such processes as lithography, drilling and chemical etching.

The material of the binder layer 80 may be adhesive and may be coated on the bottom of the recess by coating process.

It shall be noted that, when placing the bare chip 20, the pins of the bare chip 20 shall be oriented upward, so as to allow the outer leads 401 to be electrically connected to the pins of the bare chip 20 through the via holes in the buffer layer 30.

By disposing the bare chip 20 inside the recess of the substrate 10, the surface of the substrate 10 on which the bare chip 20 is disposed is somewhat smoothed, thereby facilitating the subsequent processes and improving the conformity rate.

In an example, a bare chip 20 is fixed in each recess, and the size of the recess is consistent with the size of the bare chip 20. In this way, it may be prevented that a gap exists between the recess and the bare chip 20, by which a high step occurs on the surface of the substrate 10.

In an example, as shown in FIG. 3, the outer surface of the bare chip 20 fixed inside the recess is flush with the surface of the substrate 10. That is, the combined height of the binder layer 80 and the bare chip 20 is equal to the depth of the recess.

By having the outer surface of the bare chip 20 fixed in the recess being flush with the surface of the substrate 10, the smoothness of the surface of the substrate 10 on which the bare chip 20 is disposed may be ensured, thereby further facilitating the subsequent processes and improving the conformity rate.

In an example, as shown in FIG. 4, the first metallic layer further comprises a light shielding pattern 402. In this case, the thin film transistor 50 is a polycrystalline silicon thin film transistor, and the orthographic projection of the light shielding pattern 402 on the substrate 10 covers the orthographic projection of an active layer 503 of the polycrystalline silicon thin film transistor on the substrate 10.

In case where the thin film transistor 50 is a polycrystalline silicon thin film transistor, by providing a light shielding pattern 402 between the substrate 10 and the active layer 503, impact on the performance of the polycrystalline silicon thin film transistor due to light irradiation on the active layer 503 in polycrystalline silicon material may be prevented. In this case, by disposing the light shielding pattern 402 and the outer leads 401 in the same layer, that is, by forming the light shielding pattern 402 and the outer leads 401 through the same patterning process, the encapsulation of the bare chip 20 will not result in the increase of the times of the patterning processes.

Figure 7:
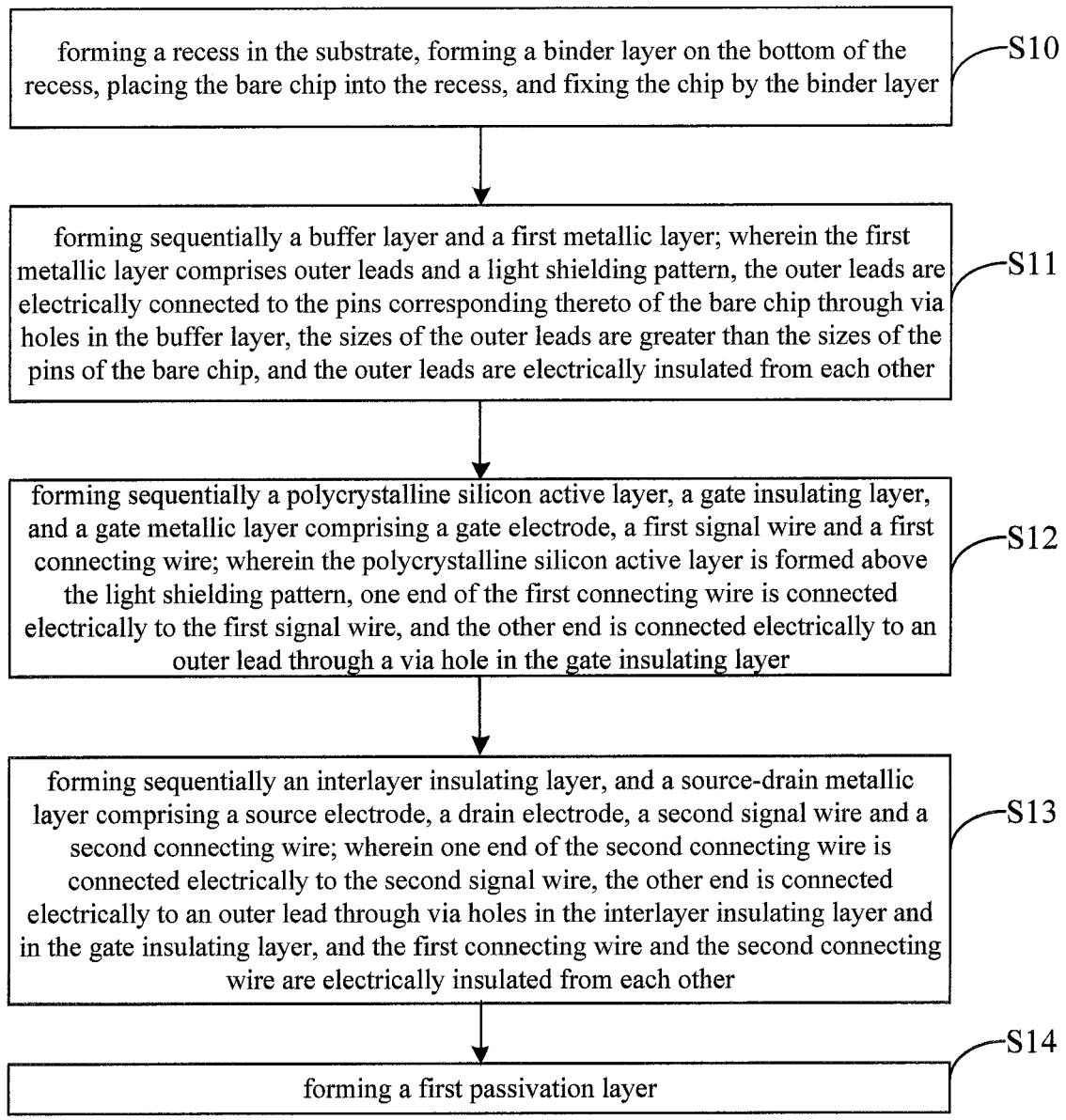
FIG. 7 is a flow chart showing a method for manufacturing an array substrate provided by the present disclosure.
Figure 8A:
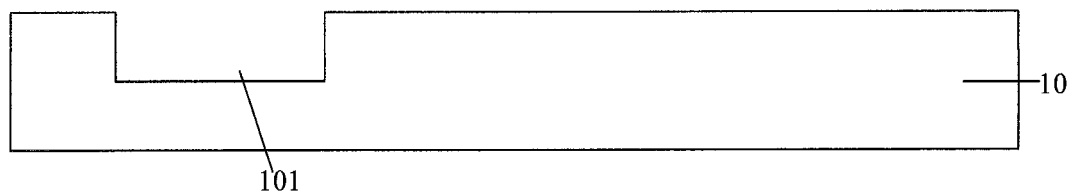
FIG. 8a to FIG. 8i are schematic diagrams showing the steps of a method for manufacturing an array substrate provided by the present disclosure.
Figure 8B:
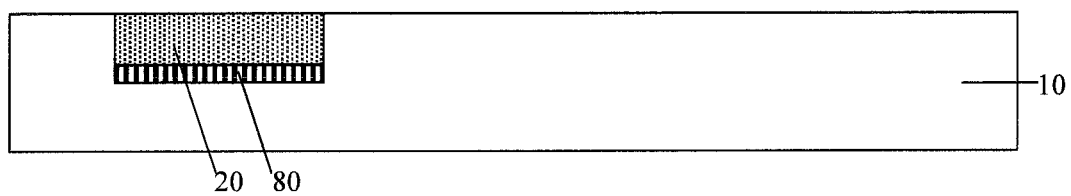

A specific embodiment is provided below for describing in detail the method of manufacturing an array substrate. As shown in FIG. 7, the method of manufacturing the array substrate comprises the following steps:

S10: as shown in FIGS. 8a and 8b, forming a recess 101 in the substrate 10, forming a binder layer 80 on the bottom of the recess 101, placing the bare chip 20 into the recess 101, and fixing the chip by the binder layer 80.

In this case, as shown in FIG. 2, the bare chip 20 is disposed in the chip arrangement region 03 in the non-displaying region 02.

Figure 8C:
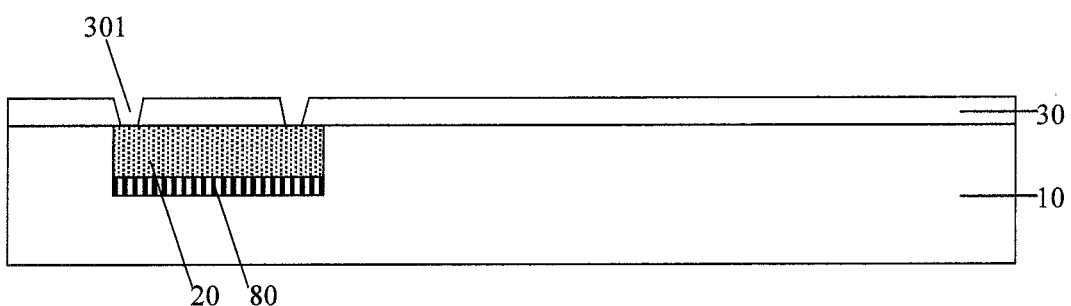
Figure 8D:
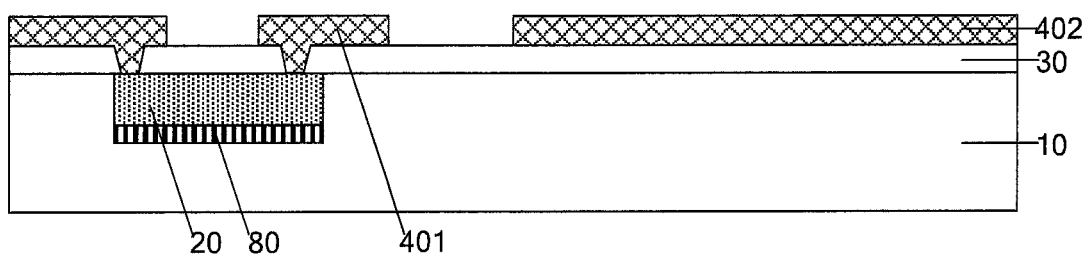

S11: as shown in FIGS. 8c and 8d, forming sequentially a buffer layer 30 and a first metallic layer; wherein the first metallic layer comprises outer leads 401 and a light shielding pattern 402, the outer leads 401 are electrically connected to the pins corresponding thereto of the bare chip 20 through via holes 301 in the buffer layer 30, the sizes of the outer leads 401 are greater than the sizes of the pins of the bare chip 20, and the outer leads 401 are electrically insulated from each other.

That is, a buffer layer 30 is firstly formed by one patterning process, the buffer layer 30 comprising via holes 301 through which the pins of the bare chip 20 are exposed. Subsequently, a first metallic layer is formed by one patterning process. In this case, said one patterning process includes the processes of film forming, lithography and etching.

In an example, the material of the buffer layer 30 comprises at least one selected from silicon oxide (SiOx) and silicon nitride (SiNx). The material of the first metallic layer may be selected from molybdenum (Mo), aluminum neodymium alloy, molybdenum aluminum alloy, etc.

Figure 8E:
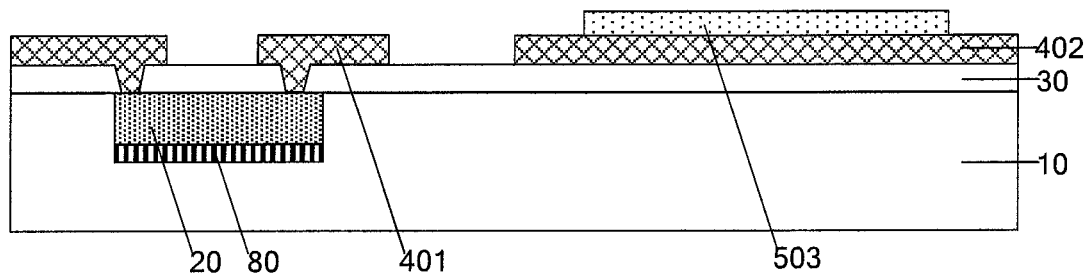
Figure 8F:
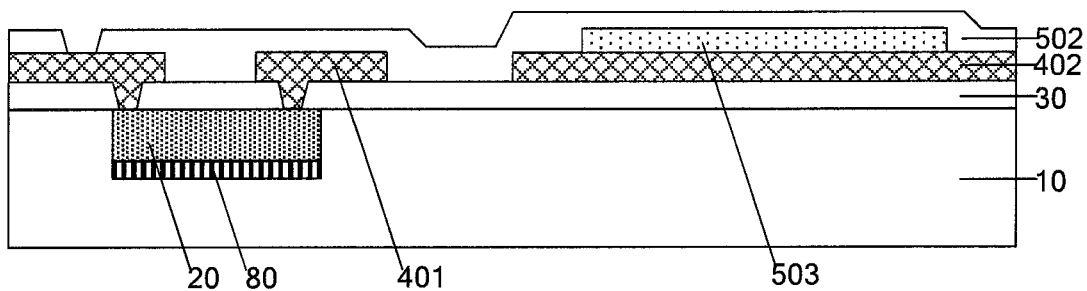
Figure 8G:
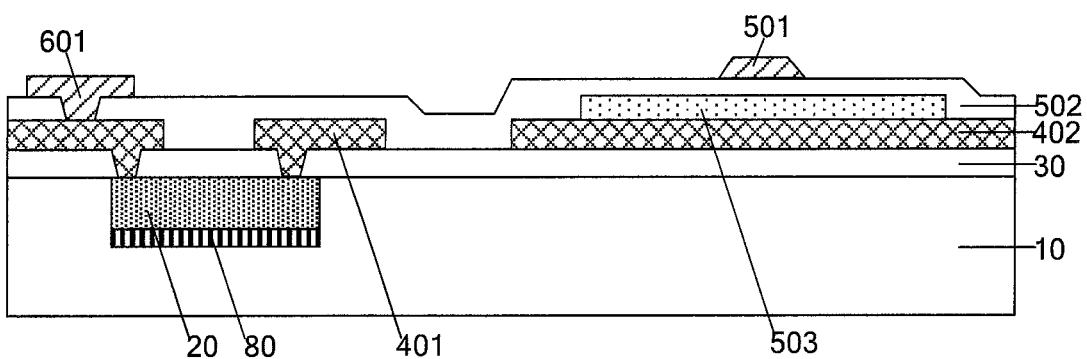

S12: as shown in FIGS. 8e, 8f and 8g, forming sequentially a polycrystalline silicon active layer 503, a gate insulating layer 502, and a gate metallic layer comprising a gate electrode 501, a first signal wire 701 and a first connecting wire 601; wherein the polycrystalline silicon active layer 503 is formed above the light shielding pattern 402, one end of the first connecting wire 601 is connected electrically to the first signal wire, and the other end is connected electrically to an outer lead 401 through a via hole in the gate insulating layer 502.

That is, a polycrystalline silicon active layer 503 is firstly formed by one patterning process, and then a gate insulating layer 502 is formed by one patterning process, the gate insulating layer 502 comprising via holes through which the outer leads 401 are exposed. Subsequently, a gate metallic layer is formed by one patterning process.

In this case, the polycrystalline silicon active layer 503 may be formed by the following specific method. An amorphous silicon thin film is deposited through Plasma Enhanced Chemical Vapor Deposition (abbreviated as PECVD), and subjected to dehydrogenation treatment with high-temperature oven to prevent the appearance of hydrogen explosion phenomenon during the crystallization process and lower the defect state density effect inside the crystallized thin film. After completion of the dehydrogenation process, a Low Temperature Poly-Silicon (LTPS) process is carried out, in which the amorphous silicon thin film is subjected to crystallization treatment with such crystallizing processes as excimer laser anneal (ELA), metal induced crystallization (MIC) and solid phase crystallization (SPC), so as to form a polycrystalline silicon thin film above the substrate 10. Afterwards, lithography and etching processes are carried out to form a polycrystalline silicon active layer 503.

Of course, it is also possible that an amorphous silicon layer is firstly formed through lithography and etching of an amorphous silicon thin film, and then a polycrystalline silicon active layer 503 is formed through LTPS process on the amorphous silicon layer.

It shall be known by a person skilled in the art that the polycrystalline silicon active layer 503 and the light shielding pattern 402 is situated in the displaying region 01 of the substrate 10.

In an example, the material of the gate insulating layer 502 comprises at least one selected from SiOx and SiNx. The material of the gate metallic layer may be selected from Mo, aluminum molybdenum alloy, etc.

Figure 8H:
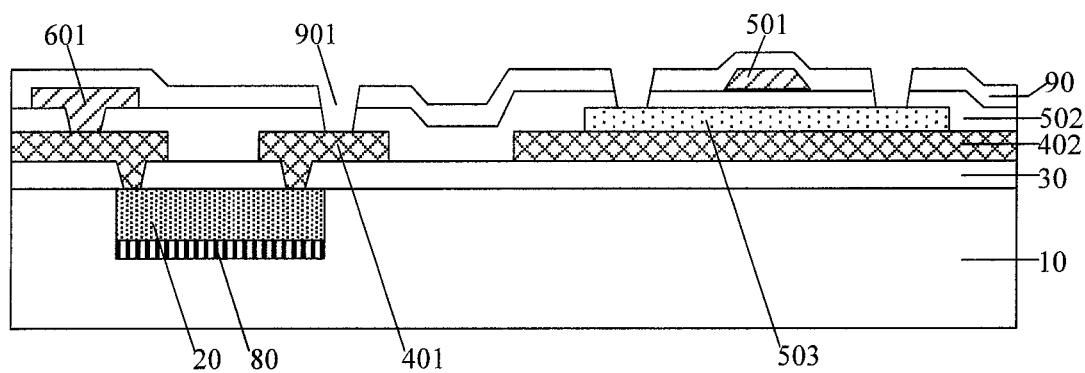
Figure 8I:
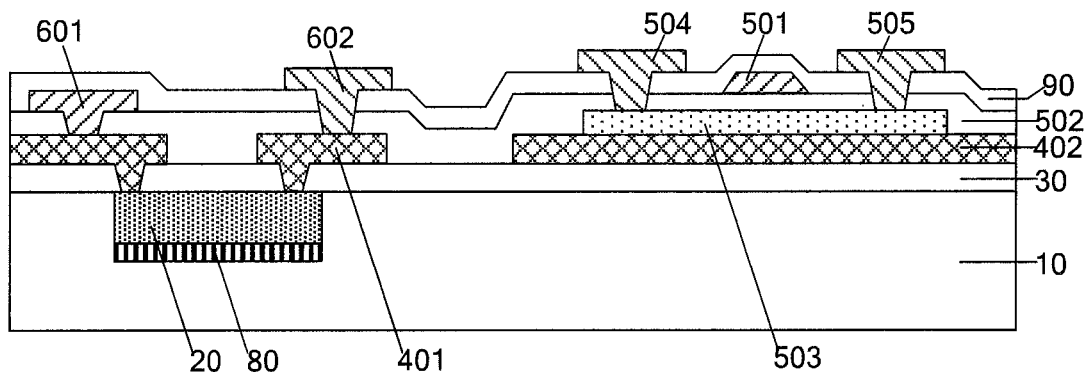

S13: as shown in FIGS. 8h and 8i, forming sequentially an interlayer insulating layer 90, and a source-drain metallic layer comprising a source electrode 504, a drain electrode 505, a second signal wire 702 and a second connecting wire 602; wherein one end of the second connecting wire 602 is connected electrically to the second signal wire, the other end is connected electrically to an outer lead 401 through via holes 901 in the interlayer insulating layer 90 and in the gate insulating layer 502, and the first connecting wire 601 and the second connecting wire 602 are electrically insulated from each other.

That is, the interlayer insulating layer 90 is firstly formed by one patterning process. To expose part of the outer leads 401 and the polycrystalline silicon active layer 503, the gate insulating layer 502 is also etched when forming the interlayer insulating layer 90 by etching, so as to form at the same time on the interlayer insulating layer 90 and the gate insulating layer 502 the via holes 901 which expose part of the outer leads 401 and allow the source electrode 504 and the drain electrode 505 to contact with the polycrystalline silicon active layer 503. A source-drain metallic layer is subsequently formed by one patterning process.

In an example, the material of the interlayer insulating layer 90 comprises at least one selected from SiOx and SiNx. The material of the source-drain metallic layer may be selected from Mo, aluminum molybdenum alloy, etc.

S14: as shown in FIG. 4, forming a first passivation layer 70.

In an example, the material of the first passivation layer 70 comprises at least one selected from SiOx and SiNx.

On the basis of the steps S10 to S14, as shown in FIG. 5 and FIG. 6, a planarization layer 100 and a first transparent electrode 110 are sequentially formed on the first passivation layer 70.

In this case, the planarization layer 100 may be made of resin material. The planarization layer 100 may have the function of further protecting the bare chip 20. The planarization layer 100 may be formed by spin-coating process. The substrate with a planarization layer 100 has a better smoothness.

The first transparent electrode 110 may be a pixel electrode or an anode electrode.

In case where the first transparent electrode 110 is a pixel electrode, as shown in FIG. 6, the method may comprise further a step of forming a second transparent electrode 120, i.e. a common electrode. The first transparent electrode 110 and the second transparent electrode 120 are separated by a second passivation layer 130.

In case where the first transparent electrode 110 is an anode electrode, the method comprises further a step of forming sequentially an organic functional layer and a cathode electrode above the anode electrode.

The foregoing is only the specific embodiments of the present disclosure and the protection scope of the present disclosure is not limited thereto. Any alterations or replacements that can be easily envisaged by a person skilled in the art in the light of the technical teaching of present disclosure shall be included in the protection scope of the present disclosure. Therefore, the protection scope of the present disclosure shall be determined by the affixed claims.

What is claimed is:

1. An array substrate, comprising
a substrate;
a bare chip fixed on the substrate, the bare chip comprising pins;
a buffer layer and a first metallic layer disposed sequentially on a side of the bare chip facing away from the substrate, the first metallic layer comprising outer leads in one-to-one correspondence with the pins of the bare chip, the outer leads being connected electrically to the pins corresponding thereto of the bare chip through via holes in the buffer layer, and the outer leads being electrically insulated from each other;
a thin film transistor; and
a first signal wire and a first connecting wire disposed in a same layer as a gate electrode of the thin film transistor, and a second signal wire and a second connecting wire disposed in a same layer as a source electrode and a drain electrode of the thin film transistor, one end of the first connecting wire being connected electrically to the first signal wire, and the other end thereof being connected electrically to one of the outer leads, one end of the second connecting wire being connected electrically to the second signal wire, and the other end thereof being connected electrically to one of the outer leads, and the first connecting wire and the second connecting wire being electrically insulated from each other,
wherein the bare chip is a chip that is not encapsulated, and the bare chip is disposed in a non-displaying region of the array substrate,
wherein an orthographic projection of the bare chip on the substrate does not overlap with an orthographic projection of the thin film transistor on the substrate.

2. The array substrate according to claim 1, wherein the substrate comprises a recess in which the bare chip is fixed.

3. The array substrate according to claim 2, wherein in the recess a bare chip is fixed, and the size of the recess is consistent with that of the bare chip.

4. The array substrate according to claim 2, wherein an outer surface of the bare chip fixed inside the recess is flush with a surface of the substrate.

5. The array substrate according to claim 1, wherein the first metallic layer further comprises a light shielding pattern.

6. The array substrate according to claim 5, wherein the thin film transistor is a polycrystalline silicon thin film transistor, and an orthographic projection of the light shielding pattern on the substrate covers an orthographic projection of an active layer of the polycrystalline silicon thin film transistor on the substrate.

7. The array substrate according to claim 1, further comprising a first passivation layer disposed on a side of the thin film transistor facing away from the substrate.

8. The array substrate according to claim 7, further comprising a planarization layer and a first transparent electrode disposed sequentially on a side of the first passivation layer facing away from the substrate, the first transparent electrode being electrically connected to the drain electrode.

9. The array substrate according to claim 1, wherein sizes of the outer leads are greater than sizes of the pins of the bare chip.

10. A display panel, comprising an array substrate according to claim 1.

11. A method for manufacturing an array substrate, comprising:
fixing a bare chip on a substrate, the bare chip comprising pins;
forming on the substrate, on which the bare chip is fixed, sequentially a buffer layer and a first metallic layer, the first metallic layer comprising outer leads in one-to-one correspondence with the pins of the bare chip, the outer leads being connected electrically to the pins corresponding thereto of the bare chip through via holes in the buffer layer, and the outer leads being electrically insulated from each other; and
forming on the substrate, on which the first metallic layer is formed, a thin film transistor, a first signal wire and a first connecting wire disposed in a same layer as a gate electrode of the thin film transistor, and a second signal wire and a second connecting wire disposed in a same layer as a source electrode and a drain electrode of the thin film transistor, one end of the first connecting wire being connected electrically to the first signal wire, the other end thereof being connected electrically to one of the outer leads, one end of the second connecting wire being connected electrically to the second signal wire, the other end thereof being connected electrically to one of the outer lead, and the first connecting wire and the second connecting wire being electrically insulated from each other, wherein the bare chip is a chip that is not encapsulated, and the bare chip is disposed in a non-displaying region of the array substrate, wherein an orthographic projection of the bare chip on the substrate does not overlap with an orthographic projection of the thin film transistor on the substrate.

12. The method according to claim 11, wherein the step of fixing a bare chip on a substrate comprises:

forming a recess in the substrate, and forming a binder layer inside the recess or on the bare chip; and placing the bare chip into the recess, and fixing the chip by the binder layer.

13. The method according to claim 12, wherein in the recess a bare chip is fixed, and the size of the recess is consistent with that of the bare chip.

14. The method according to claim 12, wherein an outer surface of the bare chip fixed inside the recess is flush with a surface of the substrate.

15. The method according to claim 11, wherein the first metallic layer further comprises a light shielding pattern; and wherein the thin film transistor is a polycrystalline silicon thin film transistor, and an orthographic projection of the light shielding pattern on the substrate covers an orthographic projection of an active layer of the polycrystalline silicon thin film transistor on the substrate.

16. The method according to claim 15, further comprising: forming a first passivation layer on a side of the thin film transistor facing away from the substrate.

17. The method according to claim 11, wherein sizes of the outer leads are greater than sizes of the pins of the bare chip.

18. The method according to claim 11, wherein the step of forming on the substrate, on which the first metallic layer is formed, a thin film transistor, a first signal wire and a first connecting wire disposed in a same layer as a gate electrode of the thin film transistor, and a second signal wire and a second connecting wire disposed in a same layer as a source electrode and a drain electrode of the thin film transistor comprises:

forming sequentially a polycrystalline silicon active layer, a gate insulating layer, and a gate metallic layer comprising a gate electrode, a first signal wire and a first connecting wire, one end of the first connecting wire being connected electrically to the first signal wire, and the other end thereof being connected electrically to one of the outer leads through a via hole in the gate insulating layer; and forming sequentially an interlayer insulating layer, and a source-drain metallic layer comprising a source electrode, a drain electrode, a second signal wire and a second connecting wire, one end of the second connecting wire being connected electrically to the second signal wire, and the other end thereof being connected electrically to one of the outer leads through via holes in the interlayer insulating layer and in the gate insulating layer.

19. The method according to claim 18, wherein the first metallic layer further comprises a light shielding pattern, and the polycrystalline silicon active layer is formed above the light shielding pattern.

20. The method according to claim 16, further comprising forming on the first passivation layer sequentially a planarization layer and a first transparent electrode, the first transparent electrode being connected electrically to the drain electrode.

* * * * *